United States Patent
Ivan et al.

(10) Patent No.: US 8,022,710 B2
(45) Date of Patent: *Sep. 20, 2011

(54) METHODS FOR COMMON MODE VOLTAGE-BASED AC FAULT DETECTION, VERIFICATION AND/OR IDENTIFICATION

(75) Inventors: William T. Ivan, Shelby Township, MI (US); Chandra S. Namuduri, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 643 days.

This patent is subject to a terminal disclaimer.

(21) Appl. No.: 12/016,527

(22) Filed: Jan. 18, 2008

(65) Prior Publication Data

US 2009/0184717 A1    Jul. 23, 2009

(51) Int. Cl.
*G01R 31/08* (2006.01)
*G01R 31/00* (2006.01)

(52) U.S. Cl. ........................................ 324/522; 324/503

(58) Field of Classification Search .................. 324/522, 324/503

See application file for complete search history.

(56) References Cited

U.S. PATENT DOCUMENTS

| | | | |
|---|---|---|---|
| 5,406,485 A | 4/1995 | Wise et al. | |
| 5,418,453 A * | 5/1995 | Wise | 324/160 |
| 5,459,732 A * | 10/1995 | Wise et al. | 701/76 |
| 5,477,472 A * | 12/1995 | Wise et al. | 702/126 |
| 5,487,595 A * | 1/1996 | Wise et al. | 303/168 |
| 6,870,423 B2 | 3/2005 | Takauchi et al. | |
| 7,176,731 B2 * | 2/2007 | Baez et al. | 327/157 |
| 7,532,010 B2 | 5/2009 | Kamel et al. | |
| 7,649,360 B2 * | 1/2010 | Ivan et al. | 324/503 |
| 2003/0201799 A1 | 10/2003 | Takauchi et al. | |
| 2004/0158167 A1 | 8/2004 | Smith et al. | |
| 2005/0168291 A1 * | 8/2005 | Karlsson | 331/16 |
| 2008/0100350 A1 | 5/2008 | Pernia et al. | |

OTHER PUBLICATIONS

Chinese Office Action for Chinese Application No. 200910002449.0 mailed on Jun. 9, 2011.

* cited by examiner

*Primary Examiner* — Jeff Natalini
(74) *Attorney, Agent, or Firm* — Ingrassia Fisher & Lorenz, P.C.

(57) ABSTRACT

Methods for AC fault (ACF) detection are provided. In addition, methods for AC fault (ACF) detection and verification are provided. In addition, methods for identification of a module which is the cause of an AC fault (ACF) are provided. In one implementation, one or more of these methods can be combined to provide a fast, simple, low cost and reliable ACF detection, verification and/or identification.

18 Claims, 9 Drawing Sheets

METHODS FOR COMMON MODE VOLTAGE-BASED AC FAULT DETECTION, VERIFICATION AND/OR IDENTIFICATION

TECHNICAL FIELD

The present invention generally relates to protection of electric and hybrid vehicle power systems, and more particularly relates to detecting an alternating current fault (ACF), and/or verifying an ACF and/or identifying a source of an ACF.

BACKGROUND OF THE INVENTION

Electric and hybrid vehicles typically include an alternating current (AC) electric motor which is driven by a direct current (DC) power source, such as a storage battery. Motor windings of the AC electric motor can be coupled to inverter module(s) which perform a rapid switching function to convert the DC power to AC power which drives the AC electric motor.

Many electric and hybrid vehicles implement an isolated high voltage DC bus which couples the inverter module(s) to the DC power source. Other modules, such as devices, components or circuits, can also be coupled to the high voltage DC bus. In some situations one of more of these modules can operate improperly and cause an electrical AC fault (ACF) to occur along the high voltage DC bus which causes high voltage spikes that can potentially damage other modules coupled to the high voltage DC bus.

One way to address ACFs is to implement a Ground Fault Interrupter (GFI) (sometimes also referred to as a residual current device (RCD), residual current circuit breaker (RCCB), ground fault circuit interrupter (GFCI)), that observes the respective currents at a ground terminal and a supply terminal, and disconnects a circuit coupled between these terminals when the differential current flow between these terminals is not balanced (i.e., zero (0)) since this signifies current leakage. Such ground fault detection circuits typically implement current transformers to detect ACF currents in the ground path. However, transformer-based ground fault detectors are expensive and bulky.

Another way to address ACFs is to implement ground fault detection using software algorithms. However, such software algorithms have long detection times.

Accordingly, it is desirable to provide a fast, simple, low cost and reliable ACF detection and/or verification circuit. It would also be desirable to provide a fast, simple, low cost and reliable ACF identification circuit which can aid in diagnosing the source of an ACF so that the source of the ACF can be turned off or disconnected from the high voltage DC bus when an ACF occurs. Furthermore, other desirable features and characteristics of the present invention will become apparent from the subsequent detailed description and the appended claims, taken in conjunction with the accompanying drawings and the foregoing technical field and background.

SUMMARY OF THE INVENTION

Embodiments of the present invention relate to methods for AC fault (ACF) detection, methods for AC fault (ACF) detection and verification, and methods for identification of a module which is the cause of an AC fault (ACF). In one embodiment, one or more of these methods can be combined to provide a fast, simple, low cost and reliable ACF detection, verification and/or identification.

A method for detecting an AC fault (ACF) caused by a module coupled to a bus of a hybrid/electric power train system. When a high-voltage DC input signal is received from the bus, the differential mode voltage component is removed from the high-voltage DC input signal to generate a common mode AC voltage signal ($V_{CM}$). A magnitude of the common mode AC voltage signal ($V_{CM}$) is measured, and it is determined whether the measured magnitude of the common mode AC voltage signal ($V_{CM}$) is greater than or equal to a fault detection threshold voltage ($V_{TH}$). When the measured magnitude of the common mode AC voltage signal ($V_{CM}$) is greater than or equal to the fault detection threshold voltage ($V_{TH}$) an AC fault (ACF) detection signal is generated. For example, in one implementation, the common mode AC voltage signal ($V_{CM}$) comprises one or more ACF voltage spikes during an ACF event and it is determined whether the measured magnitude of the common mode AC voltage signal ($V_{CM}$) is greater than or equal to a fault detection threshold voltage ($V_{TH}$), and when the measured magnitude of the common mode AC voltage signal ($V_{CM}$) is greater than or equal to the fault detection threshold voltage ($V_{TH}$) the AC fault (ACF) detection signal is generated which indicates that an ACF event has been detected.

In other embodiments, a method is provided for verifying an AC fault (ACF) caused by a module coupled to a bus of a hybrid/electric power train system. Upon receiving a high-voltage DC input signal from the bus, a common mode AC voltage signal ($V_{CM}$) biased at approximately zero volts is generated by removing a differential mode voltage component from the high-voltage DC input signal. Thereafter, a magnitude of the common mode AC voltage signal ($V_{CM}$) is measured and it is determined whether the measured magnitude is greater than or equal to a fault detection threshold voltage ($V_{TH}$). When the measured magnitude of the common mode AC voltage signal ($V_{CM}$) is greater than or equal to the fault detection threshold voltage ($V_{TH}$) an AC fault (ACF) detection signal is generated. A count is maintained which indicates a number of consecutive periods that the magnitude of the common mode AC voltage signal ($V_{CM}$) is greater than or equal to the fault detection threshold voltage ($V_{TH}$), and this count is incremented each time an ACF voltage spike is present in the common mode AC voltage signal ($V_{CM}$) while the ACF detection signal is being received. When the count is greater than or equal to a particular threshold number, a fault verification signal is generated to indicate that detection of the ACF has been verified. The count is greater than or equal to the particular threshold number when the number of consecutive periods during which an ACF voltage spike is detected is greater than or equal to the particular threshold number. This indicates that the common mode AC voltage signal ($V_{CM}$) includes a consecutive number of ACF pulses.

In other embodiments, a method is provided for identifying the module which caused the AC fault (ACF). As noted above, each module has a fundamental operating frequency ($f_{CM}$) associated therewith. A frequency (f) of the common mode AC voltage signal is determined and a frequency (f) identification signal is generated which indicates a fundamental operating frequency ($f_{CM}$) within the common mode AC voltage signal. Based on the fundamental operating frequency ($f_{CM}$) specified in the frequency (f) identification signal, the one of the modules that is the source of the ACF is determined, and a module identification signal is generated which identifies the one of the modules that is the source of the ACF. For instance, in one implementation, to determine the one of the modules that is the source of the ACF, a lookup can be performed in a lookup table which associates each module with a corresponding operating frequency of that module.

Thereafter, fault indicator information is generated which identifies the module which is causing the ACF based on the fault verification signal and the module identification signal. In one implementation, the fault indicator information comprises an output fault code with a corresponding module identifier (ID) which identifies the module which is causing the ACF. In some implementations, a signal can then be generated which stops operation of the module causing the ACF. In some implementations, another signal can be generated which causes visual display of a module identifier (ID). In some implementation, yet another signal can be generated which causes an audible indicator which indicates the module which is causing the ACF.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

Figure 1A:
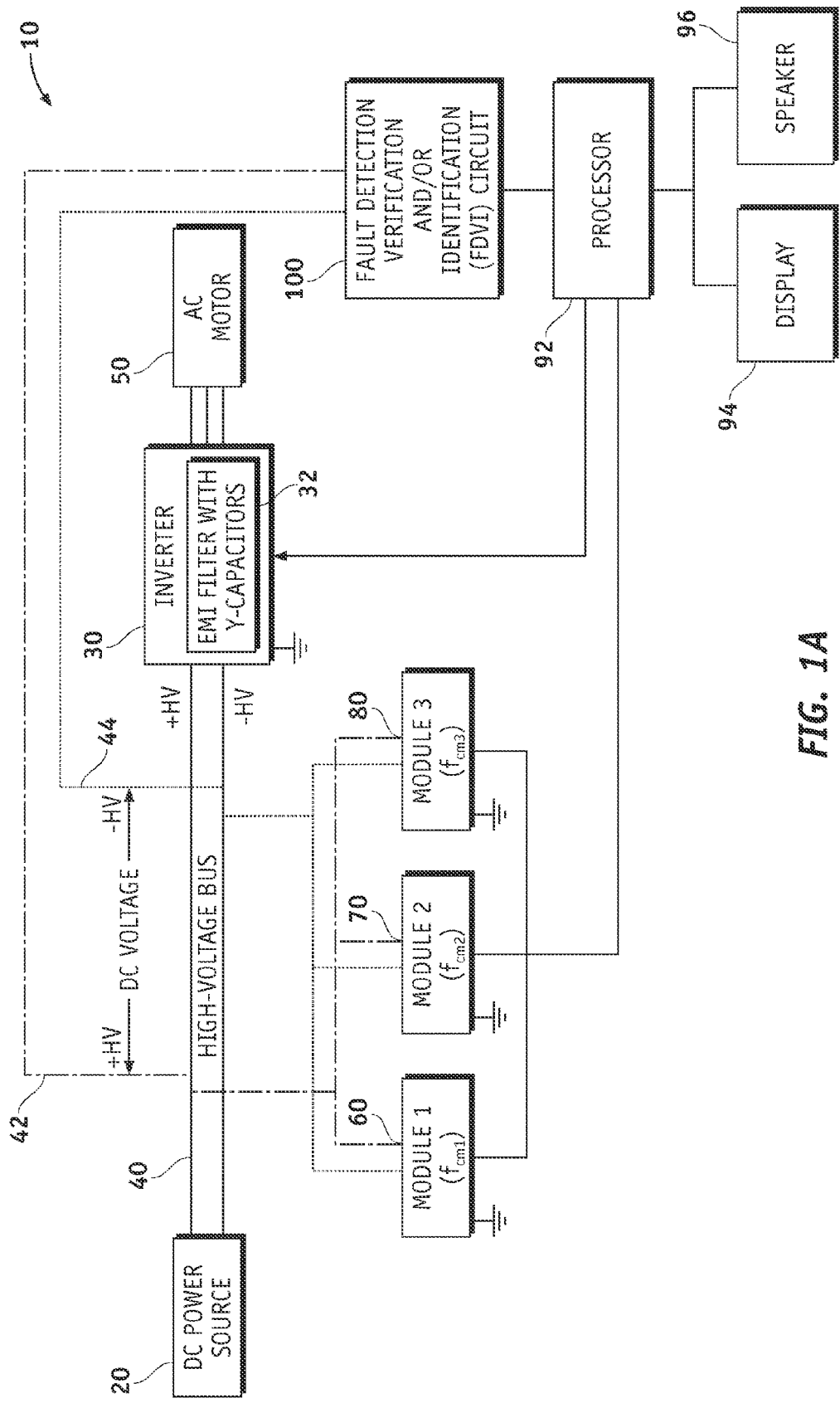
FIG. 1A illustrates a simplified block diagram of a power distribution system architecture implemented in a hybrid/electric vehicle (HEV) according to one exemplary implementation of the present invention.

As used herein, the word "exemplary" means "serving as an example, instance, or illustration." The following detailed description is merely exemplary in nature and is not intended to limit the invention or the application and uses of the invention. Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary or the following detailed description.

Before describing in detail embodiments that are in accordance with the present invention, it should be observed that the embodiments reside primarily in combinations of method steps and apparatus components related to AC fault (ACF) detection, verification and/or identification. It will be appreciated that embodiments of the invention described herein can be implemented using hardware, software or a combination thereof. The AC fault (ACF) detection, verification and/or identification circuits described herein may comprise various components, modules, circuits and other logic which can be implemented using a combination of analog and/or digital circuits, discrete or integrated analog or digital electronic circuits or combinations thereof. In some implementations, the ACF detection, verification and/or identification circuits described herein can be implemented using one or more application specific integrated circuits (ASICs), one or more microprocessors, and/or one or more digital signal processor (DSP) based circuits when implementing part or all of the ACF detection, verification and/or identification logic in such circuits. It will be appreciated that embodiments of the invention described herein may be comprised of one or more conventional processors and unique stored program instructions that control the one or more processors to implement, in conjunction with certain non-processor circuits, some, most, or all of the functions for AC fault (ACF) detection, verification and/or identification, as described herein. As such, these functions may be interpreted as steps of a method for AC fault (ACF) detection, verification and/or identification. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Overview

Embodiments of the present invention relate to methods and apparatus for AC fault (ACF) detection, methods and apparatus for AC fault (ACF) detection and verification, and methods and apparatus for identification of a module which is the cause of an AC fault (ACF). In one embodiment, one or more of these methods and apparatus can be combined to provide a fast, simple, low cost and reliable ACF detection, verification and/or identification circuit.

The disclosed methods and apparatus can be implemented in operating environments where ACFs are caused by or as a result of modules implemented along a high-voltage bus in hybrid/electric vehicle (HEV). In the exemplary implementations which will now be described, the fault detection, verification and/or identification techniques and technologies will be described as applied to a hybrid/electric vehicle (HEV). However, it will be appreciated by those skilled in the art that the same or similar fault detection, verification and/or identification techniques and technologies can be applied in the context of other AC systems which are susceptible to damage caused by an AC fault (ACF) event. In this regard, any of the concepts disclosed here can be applied generally to "vehicles," and as used herein, the term "vehicle" broadly refers to a non-living transport mechanism having an AC motor or device that can cause an AC fault to ground (chassis) potential. Examples of such vehicles include automobiles such as buses, cars, trucks, sport utility vehicles, vans, vehicles that do not travel on land such as mechanical water vehicles including watercraft, hovercraft, sailcraft, boats and ships, mechanical under water vehicles including submarines, mechanical air vehicles including aircraft and spacecraft, mechanical rail vehicles such as trains, trams and trolleys, etc. In addition, the term "vehicle" is not limited by any specific propulsion technology such as gasoline or diesel fuel. Rather, vehicles also include hybrid vehicles, battery electric vehicles, hydrogen vehicles, and vehicles which operate using various other alternative fuels.

Exemplary Implementations

FIG. 1A illustrates a simplified block diagram of a power distribution system architecture 10 implemented in a hybrid/electric vehicle (HEV) according to one exemplary implementation of the present invention.

The system 10 comprises a DC power source 20 (e.g., a battery or batteries), an inverter module 30, a high voltage DC bus 40 having two DC bus terminals (+HV, −HV) 42, 44, an AC motor 50, a number of modules/devices/circuits 60-80 coupled to the high voltage DC bus 40, a fault detection, verification and/or identification (FDVI) circuit or module 100 designed to detect and verify an AC fault (ACF) and to identify a particular one of the modules/devices/circuits 30, 60-80 which is the source or cause of the ACF, a processor 92, a display 94 and a speaker 96.

The high-voltage bus 40 is a conductor used to couple the DC power source 20, inverter module 30 and modules 60-80. The high-voltage bus 40 can be made of a conductive material, such as copper or aluminum. In these implementations, the high-voltage DC bus 40 is isolated from the vehicle chassis or "ground."

The AC motor 50 can be a "wound motor" with a stator wound into definite poles.

The inverter module 30 is coupled to the AC motor 50 using another bus. The inverter module 30 is a circuit or other device which converts direct current (DC) power to alternating current (AC) power, usually with an increase in voltage. Among other things, an inverter module oftentimes includes a DC input filter know as an electromagnetic interference (EMI) filter 32 which includes expensive filter capacitors (referred to as "Y capacitors") connected between chassis (ground) and the high voltage DC bus 40. In this implementation, the two DC bus terminals +HV 42, −HV 44 are referenced to ground (e.g., the vehicle chassis), and two Y-capacitors (not illustrated) are coupled together (at ground) between the two terminals +HV 42, −HV 44. The DC high voltage bus 40, 42 is isolated from chassis ground with a DC resistance usually greater than 1.0 megaohm. The voltage on the DC bus can range anywhere from +/−50 V DC to +/−several hundred volts DC. Usually the DC high voltage bus is referenced at ½ the amplitude relative to chassis ground. For example, terminals of the a 100 V DC bus can be biased at +50 V relative to chassis ground and −50 V relative to chassis ground. The two DC bus terminals +HV 42, −HV 44 are coupled to the inverter 30. Such capacitors are not only expensive, but are relatively difficult to replace in the event they fail. An ACF event may cause a high-AC current to be applied to the two Y-capacitors in excess of 100 times the normal operating current, to which the two Y-capacitors will fail.

As used herein the term "module" refers to a device, a circuit, an electrical component, and/or a software based component for performing a task. The modules/devices/circuits 30, 60-80 each have an identifiable, fundamental operating switching frequency ($f_{CM}$) associated therewith, that switches power from the DC bus. Although only four modules/devices/circuits 30, 60-80 are illustrated for purposes of discussion, it will be appreciated that in other implementations fewer or more modules/devices/circuits 60-80 can be coupled to the terminals (+HV 42,−HV 44) of the high-voltage bus 40. The modules/devices/circuits 60-80 can be, for example, a converter (e.g., a DC-to-DC converter module), an inverter (e.g., a Power Inverter Module (PIM) such as a quad-PIM) or modules and/or sub-modules thereof which have an identifiable switching frequency ($f_{CM}$), an engine cooling fan module, etc. Each of the modules/devices/circuits 60-80 has a fundamental operating frequency ($f_{CM}$) associated therewith, and can act as a source or cause of an ACF along the high voltage DC bus 40. As used herein, the term "AC fault (ACF)" refers to the switched (AC) output of an inverter which inadvertently becomes partially or totally shorted to ground (chassis). An ACF is typically observed or detected by a series of ACF events or a particular number of consecutive ACF-type voltage spikes.

Figure 1B:
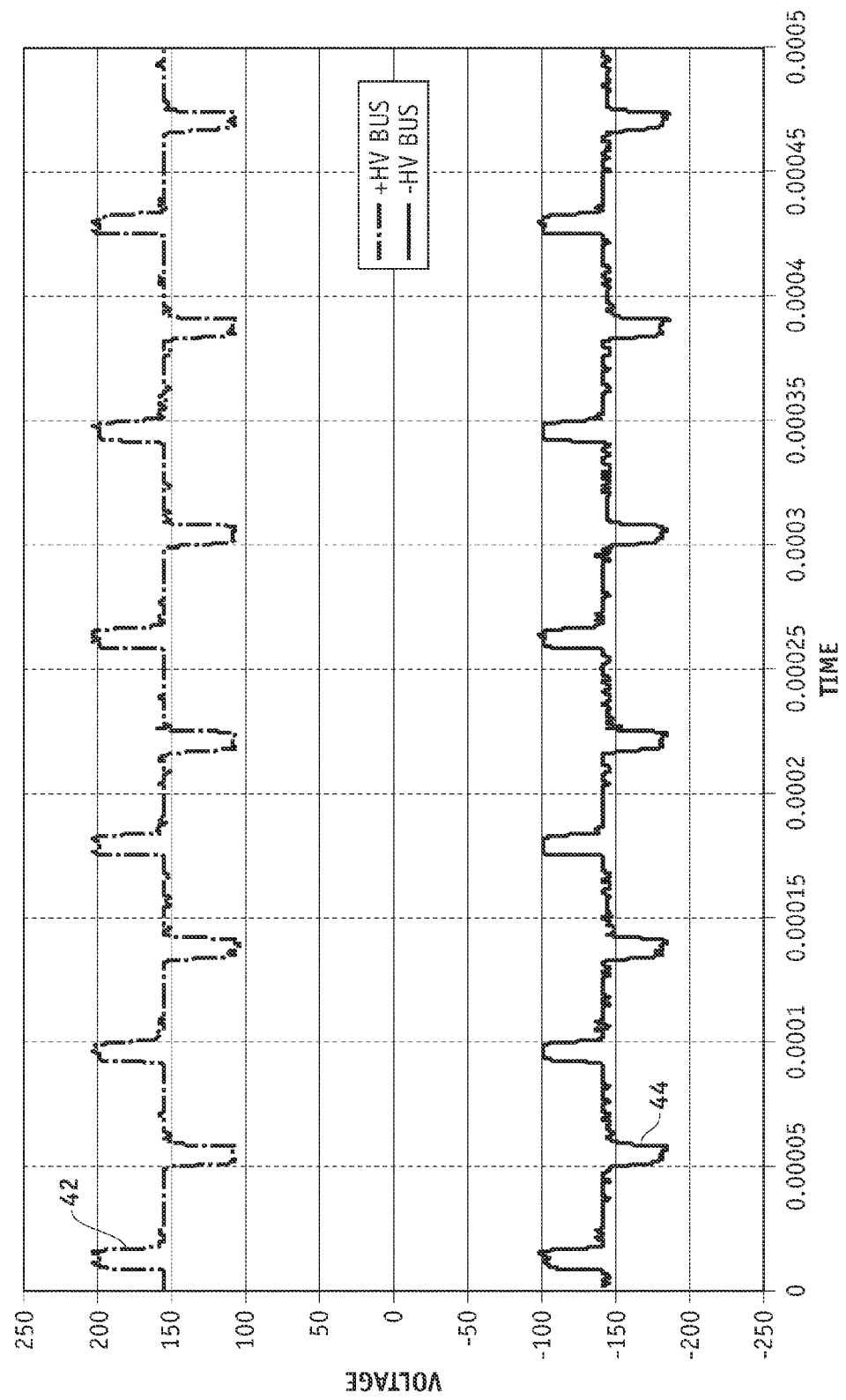
FIG. 1B illustrates the high voltage (HV) DC input signal from a HV bus relative to chassis ground.

FIG. 1B illustrates the high voltage DC input signal 115 from the bus. The high voltage DC input signal 115 includes a common mode noise on a high-voltage (HV) bus relative to chassis ground. As illustrated in FIG. 1B, the high voltage DC input signal 115 has two components one on the +HV bus 42 relative to chassis ground and another on the −HV bus 44 relative to chassis ground, and the common mode voltage has the same amplitude and phase relative to chassis ground. When amplitude of the ripple portion of the high voltage DC input signal 115 becomes high enough (e.g., when there is a direct short AC fault (ACF) event), components, such as the Y-capacitors can be damaged.

As will be described in detail below, the FDVI module 100 can detect an ACF event or event(s), and/or verify that ACF event(s) signal an actual ACF, and/or identify one of the modules which is the cause or source of a detected ACF or verified ACF. While FIG. 1A illustrates the FDVI module 100 as an independent module that is implemented outside of the inverter module 30 and the modules 60-70, in other implementations, the FDVI module 100 can be implemented within or as part of the inverter module 30, or within or as part of one or more of the modules 60-70.

Figure 2A:
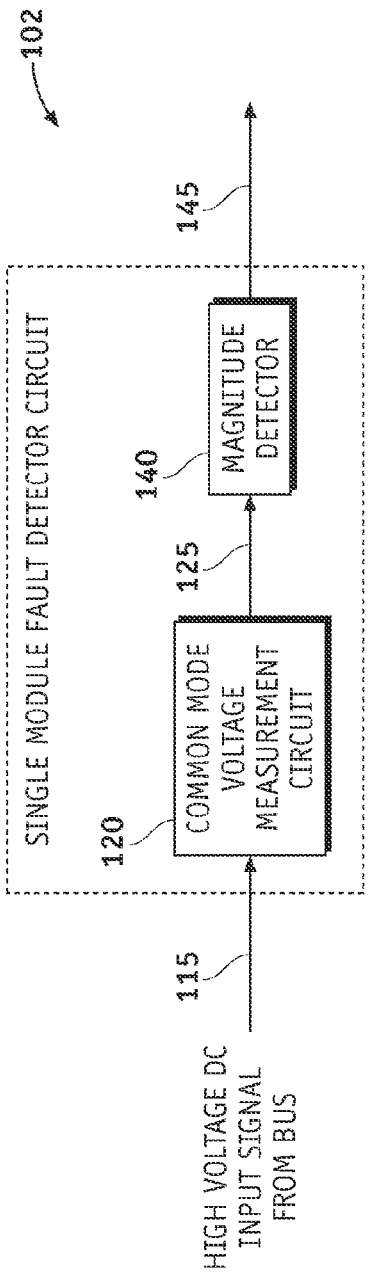
FIG. 2A illustrates a simplified block diagram of a fault detection circuit (FDC) according to one exemplary implementation of the present invention.

FIG. 2A illustrates a simplified block diagram of a fault detection circuit (FDC) 102 according to one exemplary implementation of the present invention. The FDC 102 will be described below with reference to an implementation where the FDC 100 is utilized in a battery or fuel-cell operated HEV which includes a hybrid/electric power train system 10 such as that illustrated in FIG. 1A, however, the FDC 102 can be implemented in a variety of other applications or implementations to detect an ACF. In this exemplary implementation, the FDC 102 is coupled to the high voltage DC bus 40 by a high voltage DC input circuit which generates a high-voltage DC input signal 115 between the DC bus terminals 42, 44.

The FDC 102 comprises a common mode voltage detector circuit 120 and a level/amplitude/magnitude detector 140. The common mode voltage detector/measurement circuit 120 designed to receive the high-voltage DC input signal 115, and to generate a scaled, common mode AC voltage signal ($V_{CM}$) 125 by removing a differential mode DC voltage component from the high-voltage DC input signal 115. The scaled common mode AC voltage signal ($V_{CM}$) 125 indicates a scaled value of the common mode AC voltage measured across the high voltage DC bus 40. For example, as illustrated in FIG. 2C, when the high-voltage DC input signal 115 passes through the common mode voltage detector circuit 120, the differential mode DC component is eliminated and the resultant scaled, common mode AC voltage signal ($V_{CM}$) 125 is biased at approximately zero volts (and, in this example ranges 123 between 13.6 volts and −13.6 volts).

The level/amplitude/magnitude detector 140 is coupled to the common mode voltage detector circuit 120. The level/amplitude/magnitude detector 140 is designed to measure a level of the scaled, common mode AC voltage signal ($V_{CM}$) 125, and compare the measured magnitude/amplitude of the scaled, common mode AC voltage signal ($V_{CM}$) 125 to a fault detection threshold voltage ($V_{TH}$).

Figure 2D:
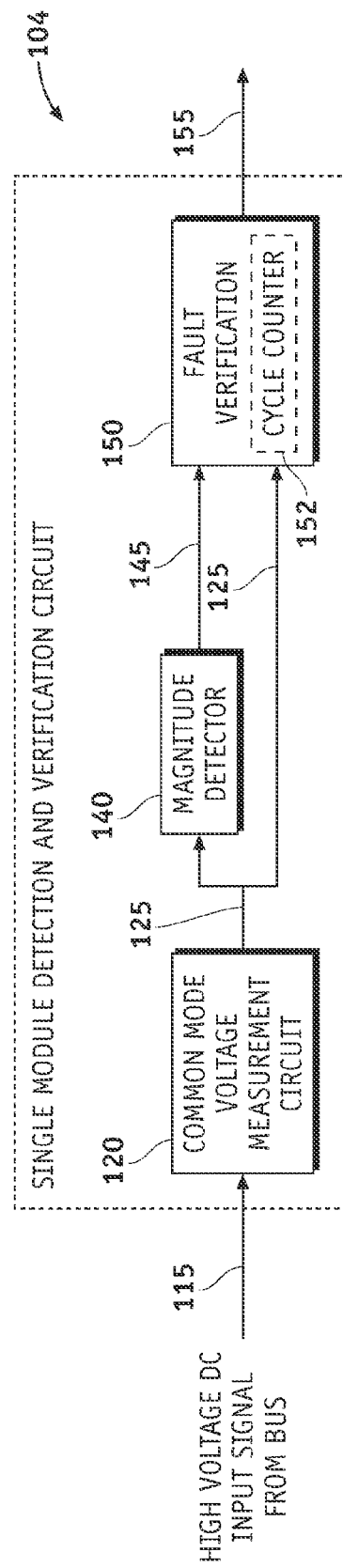
FIG. 2D illustrates a simplified block diagram of a fault detection and verification circuit (FDVC) according to one exemplary implementation of the present invention.
Figure 2B:
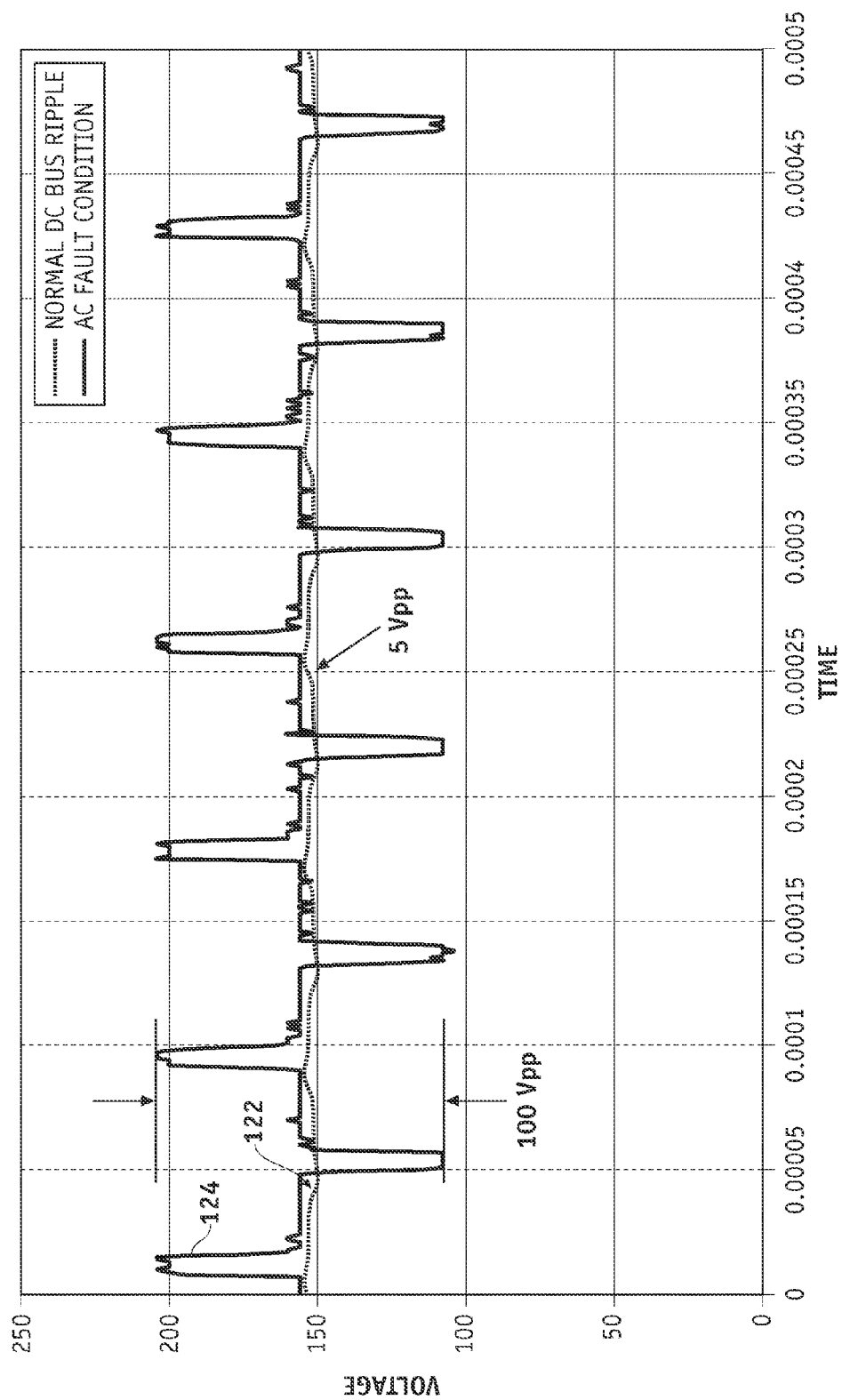
FIG. 2B is a graph which illustrates a measured level of the voltage on +HV bus relative to chassis ground.

FIG. 2B is a graph which illustrates a measured level of the voltage on +HV bus 42 relative to chassis ground. Reference numeral 122 illustrates the voltage waveform during a normal operation of the HV DC bus 40, whereas reference numeral 124 illustrates the voltage waveform when an ACF event is occurring on the HV DC bus 40.

Figure 2C:
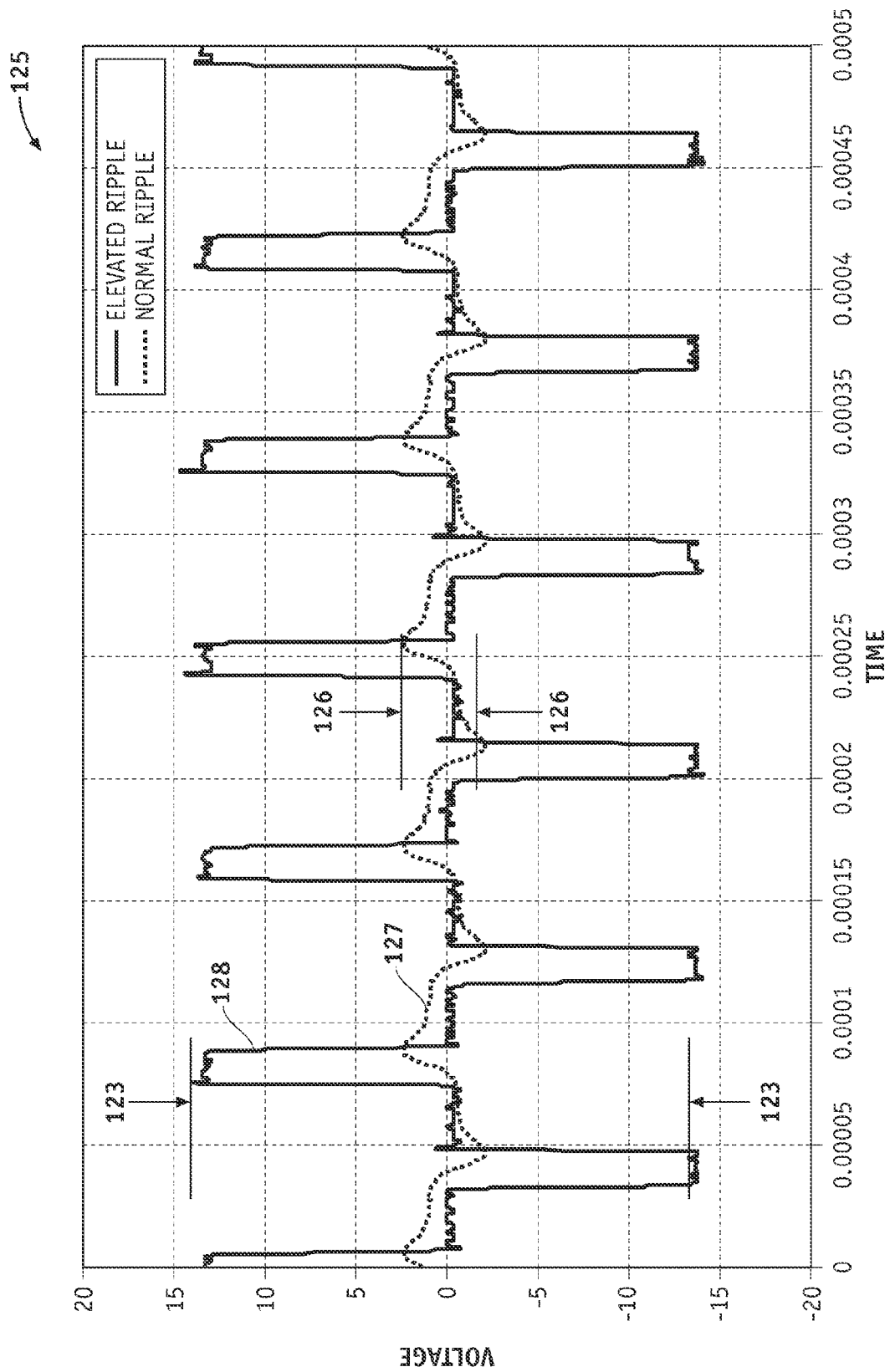
FIG. 2C is a graph which illustrates a common mode AC voltage signal ($V_{CM}$) during a normal operation and when an ACF event occurs.

FIG. 2C is a graph which illustrates a measured level of the common mode AC voltage signal ($V_{CM}$) 125 when the differential mode voltage is removed. In this particular example, during normal operation of the HV DC bus 40, the scaled, common mode AC voltage signal ($V_{CM}$) 127 is DC offset at approximately 0.0 volts DC (i.e., the normal ripple voltage 127 is 5 volts peak-to-peak ($5V_{pp}$) (between arrows 126) and biased at 0.0 volts. By contrast, during an exemplary ACF event 128 when ACF voltages are present, the common mode AC voltage signal ($V_{CM}$) 125 is approximately 27.6 volts peak-to-peak ($V_{pp}$) (between arrows 123) and centered at 0.0 volts.

Thus, when the measured magnitude/amplitude of the scaled, common mode AC voltage signal ($V_{CM}$) 125 is greater than or equal to the fault detection threshold voltage ($V_{TH}$) (e.g., when the level/amplitude/magnitude of the scaled, common mode AC voltage signal ($V_{CM}$) 125 crosses the fault detection threshold voltage ($V_{TH}$)), the level/amplitude/magnitude detector 140 generates and outputs a signal 145 (e.g., a logical one) which indicates that a ACF event has been detected. By contrast, when the level/amplitude/magnitude detector 140 determines that the magnitude/amplitude of the scaled, common mode AC voltage signal ($V_{CM}$) 125 is less than the fault detection threshold voltage ($V_{TH}$), the level/amplitude/magnitude detector 140 does not generate an output and does not indicate that an ACF event has been detected.

In some implementations it is desirable to provide fault verification to help ensure that a perceived ACF event is actually caused by an ACF, and is not a false indicator due, for instance, to noise or some other intermittent disturbance in the system.

FIG. 2D illustrates a simplified block diagram of a fault detection and verification circuit (FDVC) 104 according to one exemplary implementation of the present invention. As above, the FDVC 104 will be described below with reference to an implementation where the FDVC 104 is utilized in a battery or fuel-cell operated HEV which includes a hybrid/electric power train system 10 such as that illustrated in FIG. 1A, however, the FDVC 104 can be implemented in a variety of other applications or implementations to detect and verify an ACF. As above, in this exemplary implementation, the FDVC 104 is coupled to the high voltage DC bus 40 by a high voltage DC input circuit which generates a high-voltage DC input signal 115 between the DC bus terminals 42, 44.

The FDVC 104 comprises a common mode voltage detector circuit 120, a level/amplitude/magnitude detector 140, and a fault verification unit 150. The common mode voltage detector circuit 120, and the level/amplitude/magnitude detector 140 operate as described above with reference to FIGS. 2A and 2B.

When the measured magnitude/amplitude of the scaled, common mode AC voltage signal ($V_{CM}$) 125 is greater than or equal to the fault detection threshold voltage ($V_{TH}$) (e.g., when the level/amplitude/magnitude of the scaled, common mode AC voltage signal ($V_{CM}$) 125 crosses the fault detection threshold voltage ($V_{TH}$)), the level/amplitude/magnitude detector 140 generates and outputs a counter enable signal 145 (e.g., a logical one) which it provides to a cycle counter 152 which is implemented in the fault verification unit 150. By contrast, when the level/amplitude/magnitude detector 140 determines that the magnitude/amplitude of the scaled, common mode AC voltage signal ($V_{CM}$) 125 is less than the fault detection threshold voltage ($V_{TH}$), the level/amplitude/magnitude detector 140 does not generate an output (or maintains an output signal (e.g., a logical zero)) which it provides to the cycle counter 152 in which case the cycle counter 152 is not enabled.

The cycle counter 152 is enabled by the counter enable signal 145 whenever an ACF event is detected by the level/amplitude/magnitude detector 140 (e.g., signal 145 is high). The cycle counter 152 increments a register (not illustrated) in the cycle counter 152 if, and only if, the cycle counter 152 is enabled and an ACF voltage spike is present in the scaled, common mode AC voltage signal ($V_{CM}$) 125 while the cycle counter 152 is enabled by the counter enable signal 145.

The cycle counter 152 maintains a count which indicates a number of consecutive periods that the magnitude/amplitude of the scaled, common mode AC voltage signal ($V_{CM}$) 125 is greater than or equal to the fault detection threshold voltage ($V_{TH}$) while the cycle counter 152 is enabled. When the count maintained by the cycle counter 152 is greater than or equal a particular or predetermined threshold number of consecutive cycles (e.g., 3 consecutive times) or "count," then the fault verification unit 150 generates a fault verification signal 155 to indicate that the ACF has been verified (i.e., verifies that the number of ACF voltage spikes is sufficient to signify a true ACF condition). When the count is greater than or equal to the particular number, this signifies that the number of consecutive periods during which an ACF-type pulse or "ACF voltage spike" is received is greater than some threshold number, and therefore it can be assumed that an actual AC fault (ACF) exists since this indicates that the scaled, common mode AC voltage signal ($V_{CM}$) 125 includes a consecutive string of ACF-type pulses or ACF voltage spikes rather than an intermittent or random ACF-type pulse or ACF voltage spike.

The cycle counter 152 resets whenever the counter enable signal 145 is not received during consecutive periods (as determined from the scaled, common mode AC voltage signal ($V_{CM}$) 125). When the cycle counter 152 resets before reaching a particular or predetermined number of consecutive cycles or "count," then it can be assumed that the ACF-type pulse is an intermittent or false fault indicator (e.g., in a situation where a single ACF-type pulse occurs that is not associated with an actual ACF, but is instead attributable to noise). In this situation, the fault verification unit 150 does not output a fault verification signal 155.

In some cases, multiple modules can be provided in a system (as illustrated for example in FIG. 1A), and each of these modules can act as a cause or a source of an ACF event. In such cases, it is desirable to provide a mechanism for identifying the particular module which is the source or cause of the ACF. In some implementations, once the ACF has been detected and/or verified, the source of the ACF can be identified so that a control system can take an appropriate action given the nature of the ACF. In some embodiments, the methods and apparatus can aid in diagnosing the source of an ACF so that the source of the ACF can be turned off or disconnected from a high voltage DC bus.

Figure 2E:
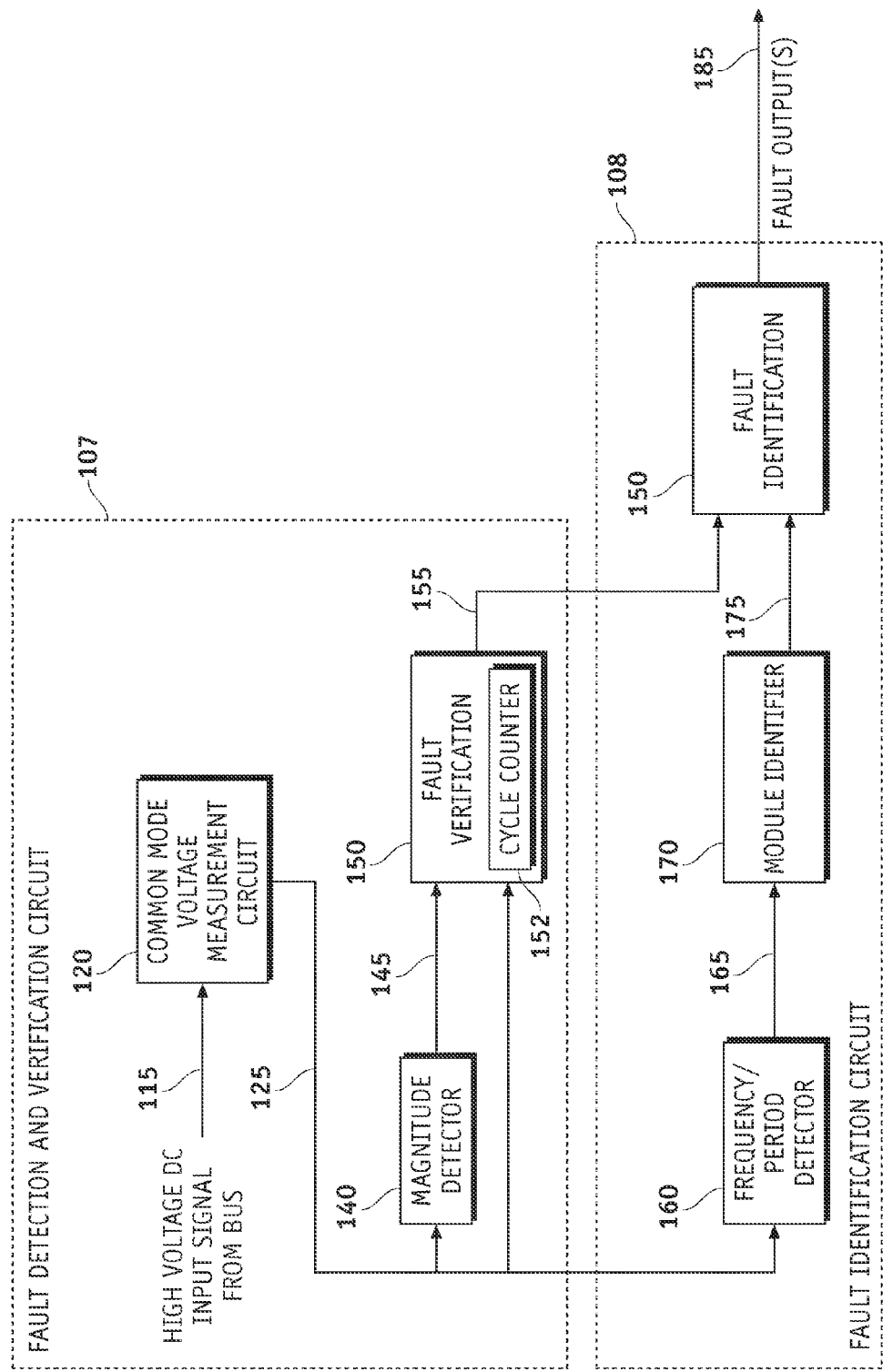
FIG. 2E illustrates a simplified block diagram of a fault detection, verification and identification circuit (FDVIC) according to one exemplary implementation of the present invention.

FIG. 2E illustrates a simplified block diagram of a fault detection, verification and identification circuit (FDVIC) 100 according to one exemplary implementation of the present invention. The FDVIC 100 will be described below with reference to an implementation where the FDVIC 100 is utilized in a battery or fuel-cell operated HEV which includes a hybrid/electric power train system 10 such as that illustrated in FIG. 1A, however, the FDVIC 100 can be implemented in a variety of other applications or implementations to detect and/or verify an ACF, and/or to identify a module, device or circuit which is a source of such an ACF. In this exemplary implementation, the FDVIC 100 is coupled to the high voltage DC bus 40 by a high voltage DC input circuit which generates a high-voltage DC input signal 115 between the DC bus terminals 42, 44.

The FDVIC 100 comprises a common mode voltage detector circuit 120, a level/amplitude/magnitude detector 140, a fault verification unit 150; a period/frequency detector 160, a module identification unit 170, and a fault indicator unit 180. The common mode voltage detector circuit 120 and the level/amplitude/magnitude detector 140 are described above.

When the measured magnitude/amplitude of the common mode AC voltage signal ($V_{CM}$) 125 is greater than or equal to the fault detection threshold voltage ($V_{TH}$) (e.g., when the level/amplitude/magnitude of the common mode AC voltage signal ($V_{CM}$) 125 crosses the fault detection threshold voltage ($V_{TH}$)), the level/amplitude/magnitude detector 140 generates and outputs a counter enable signal 145 (e.g., a logical one) which it provides to a cycle counter 152 which is implemented in the fault verification unit 150. The cycle counter 152 indicates that a ACF event has been detected.

By contrast, when the level/amplitude/magnitude detector 140 determines that the magnitude/amplitude of the common mode AC voltage signal ($V_{CM}$) 125 is less than the fault detection threshold voltage ($V_{TH}$), the level/amplitude/magnitude detector 140 does not generate an output (or maintains an output signal (e.g., a logical zero) which it provides) to the cycle counter 152 in which case the cycle counter 152 is not enabled.

The fault verification unit 150 is coupled to the level/amplitude/magnitude detector 140.

The cycle counter 152 is enabled by the counter enable signal 145 whenever an ACF event is detected by the level/amplitude/magnitude detector 140 (e.g., signal 145 is high). The cycle counter 152 increments a register (not illustrated) in the cycle counter 152 if, and only if, the cycle counter 152 is enabled and an ACF voltage spike is present in the common mode AC voltage signal 125 while the cycle counter 152 is enabled by the counter enable signal 145.

The cycle counter 152 maintains a count which indicates a number of consecutive periods that the magnitude/amplitude of the common mode AC voltage signal 125 is greater than or equal to the fault detection threshold voltage ($V_{TH}$) while the cycle counter 152 is enabled. When the count maintained by the cycle counter 152 is greater than or equal a particular or predetermined threshold number of consecutive cycles (e.g., 3 consecutive times) or "count," then the fault verification unit 150 generates a fault verification signal 155 to indicate that the ACF has been verified (i.e., verifies that the number of ACF voltage spikes is sufficient to signify a true ACF condition). When the count is greater than or equal to the particular number, this signifies that the number of consecutive periods during which an ACF-type pulse or "ACF voltage spike" is received is greater than some threshold number, and therefore it can be assumed that an actual AC fault (ACF) exists since this indicates that the common mode AC voltage signal 125 includes a consecutive string of ACF-type pulses or ACF voltage spikes rather than an intermittent or random ACF-type pulse or ACF voltage spike.

The cycle counter 152 resets whenever the counter enable signal 145 is not received during consecutive periods (as determined from the common mode AC voltage signal 125). When the cycle counter 152 resets before reaching a particular or predetermined number of consecutive cycles or "count," then it can be assumed that the ACF-type pulse is an intermittent or false fault indicator (e.g., in a situation where a single ACF-type pulse occurs that is not associated with an actual ACF, but is instead attributable to noise). In this situation, the fault verification unit 150 does not output a fault verification signal 155.

In this implementation, the fundamental frequency ($f_{CM}$) of the module causing the ACF can be determined. The frequency detector 160 is also coupled to the common mode AC voltage signal 125. The frequency detector 160 is designed to determine a frequency (f) of the common mode AC voltage signal 125, and to generate a frequency (f) identification signal 165 which indicates the center frequency ($f_c$) of the common mode AC voltage signal 125.

The module identification unit 170 is coupled to the frequency detector 160. The module identification unit 170 is designed to receive the fundamental operating frequency ($f_{CM}$) identification signal 165, and determine the module that is the source of the AC fault (ACF) based on the fundamental operating frequency ($f_{CM}$). For example, in one implementation, the module identification unit 170 can determine the module that is the source of the AC fault (ACF) by performing a lookup in a lookup table which associates each module with a corresponding operating frequency of that module. After determining which module is the source of the AC fault (ACF), the module identification unit 170 can generate a module identification signal 175 which identifies the module that is the source of the AC fault (ACF).

The fault indicator unit 180 is coupled to the fault verification unit 150 and the module identification unit 170. When the fault indicator unit 180 receives both the fault verification signal 155 and the module identification signal 175, the fault indicator unit 180 generates information 185 which identifies the module which is causing the AC fault (ACF). In one implementation, the information 185 comprises a fault indicator signal 185. The fault indicator signal 185 may include, for example, an output fault code with a corresponding module identifier (ID) which identifies the module which is causing the AC fault (ACF). In some implementations, the processor 92, upon processing the fault indicator signal 185, can generate a signal which either stops operation (e.g., turns off) of the module causing the AC fault (ACF) or disconnects the module causing the AC fault (ACF) from the high voltage DC bus 40.

In one implementation, the processor 92, upon processing the fault indicator signal 185, can send a signal to the display 94 which causes the display 94 to visually display the module identifier (ID) which identifies the module which is causing the AC fault (ACF).

In another implementation, the processor 92, upon processing the fault indicator signal 185, can send a signal to the an audio unit which includes speaker 96 thereby causing the speaker 96 to provide an audible indicator which indicates the AC fault (ACF) and/or identifies the module which is causing the AC fault (ACF).

Figure 3A:
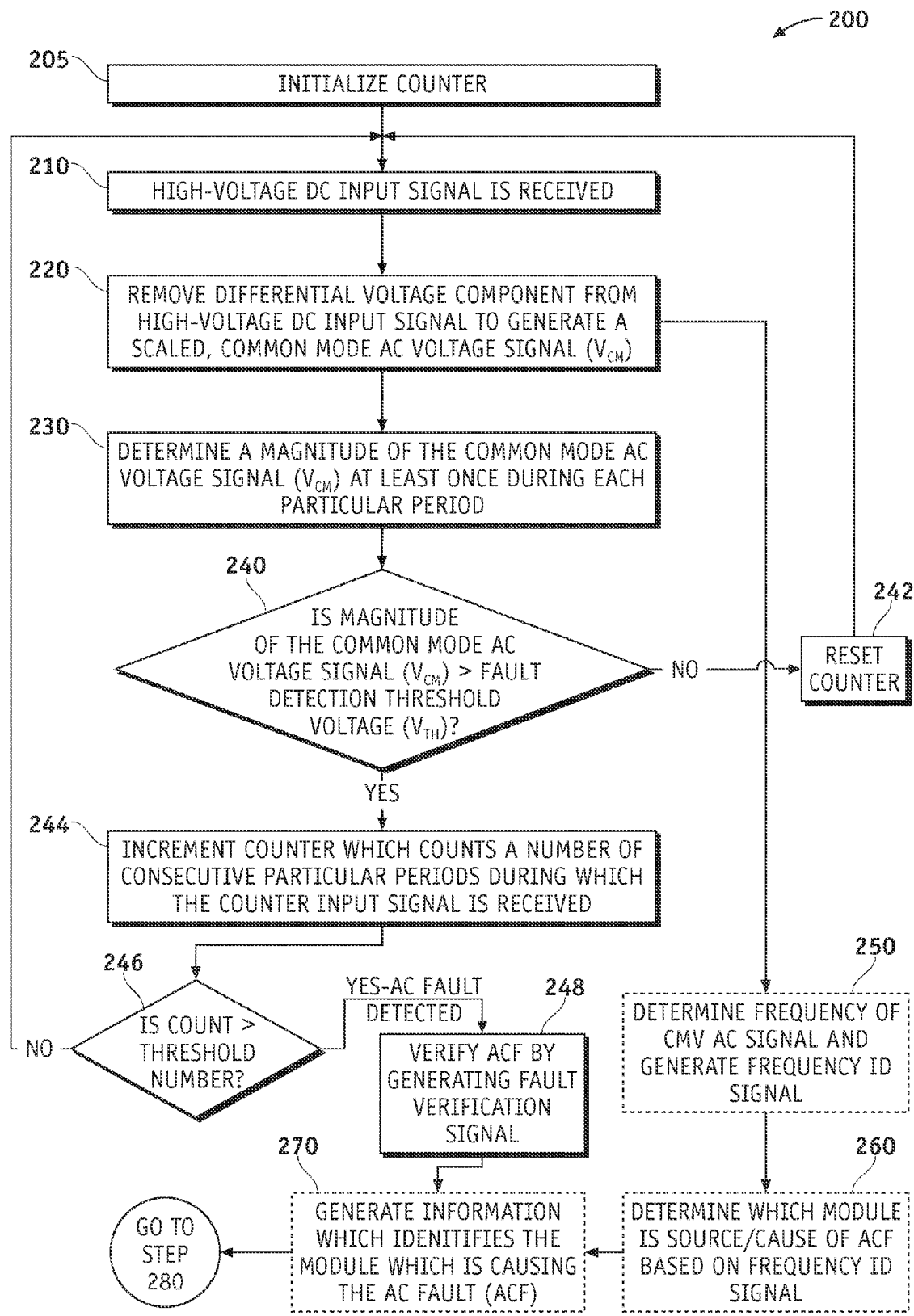
FIGS. 3A and 3B illustrate a method for detecting, verifying and/or identifying an AC fault (ACF) according to one exemplary implementation of the present invention.

FIG. 3A illustrates a method 200 for detecting, verifying and identifying an AC fault (ACF) according to one exemplary implementation of the present invention. The method 200 will be described below with reference to an implementation where the method 200 is utilized to detect an ACF, verify an ACF and/or identify a module causing an ACF in a battery or fuel-cell operated HEV which includes a hybrid/ electric powertrain system 10 such as that illustrated in FIG. 1A; however, the method 200 can be applied in a variety of other applications or implementations to detect an ACF, verify an ACF and/or identify a module, device or circuit which is a source or cause of an ACF.

At step 205 a counter 205 and/or other calibration parameters are initialized. At step 210, a high-voltage DC input signal 115 is received, and at step 220, the differential (DC) voltage component is removed from the high-voltage DC input signal 115 to generate a scaled, common mode AC voltage signal ($V_{CM}$) 125 which indicates a scaled value of a common mode AC voltage that is measured across the high voltage DC bus 40.

At step 230, a magnitude of the common mode AC voltage signal ($V_{CM}$) 125 is determined at least once during each particular period, and at step 240, it is determined whether the magnitude of the common mode AC voltage signal ($V_{CM}$) 125 is greater than or equal to a fault detection threshold voltage ($V_{TH}$).

When the magnitude/amplitude of the common mode AC voltage signal ($V_{CM}$) 125 is less than the fault detection threshold voltage ($V_{TH}$), the method 200 proceeds to step 242 where the cycle counter 152 is reset, and the method 200 then loops back to step 210. When the magnitude/amplitude of the common mode AC voltage signal ($V_{CM}$) 125 is greater than or equal to the fault detection threshold voltage ($V_{TH}$), the method 200 proceeds to step 244 where a cycle counter 152 (not illustrated), which counts a number of consecutive particular periods during which the cycle counter 152 input signal is received, is incremented.

Method 200 then proceeds to step 246, where it is determined whether a count maintained by the cycle counter 152, which indicates a number of consecutive periods that the magnitude/amplitude of the common mode AC voltage signal ($V_{CM}$) 125 is greater than or equal to the fault detection threshold voltage ($V_{TH}$), is greater than or equal to is greater than or equal to a particular threshold number (e.g., 3).

When it is determined at step 246 that the count maintained by the cycle counter 152 is less than the particular threshold number (e.g., 3), the method 200 loops back to step 210, to continue monitoring for additional ACF voltage spikes. Notably, if another spike is not detected at step 240 before reaching a particular count, then the counter resets since the number of consecutive particular periods during which the counter input signal is received is less than a threshold number, and it can therefore be assumed that the prior ACF-type pulses were intermittent or false fault indicators.

When it is determined at step 246 that the count maintained by the cycle counter 152 is greater than or equal to the particular threshold number (e.g., 3), the method 200 proceeds to step 248, where a fault verification signal 155 is generated. When the number of consecutive particular periods during which an ACF-type pulse is received is greater than the particular threshold number, detection of an ACF is verified by generating a fault verification signal. In short, it can be assumed that an actual AC fault (ACF) exists (as opposed to false indicator, for instance, in a situation where a single pulse occurs that is not associated with an actual ACF), when the count exceeds the particular threshold number (e.g., 3). Stated differently, if the number of consecutive particular periods during which the cycle counter 152 input signal is received is greater than or equal to the threshold number, there is a good chance that an actual AC fault (ACF) exists since this indicates that the common mode AC voltage signal 125 includes a continuous number of ACF-type pulses rather than an intermittent or random ACF-type pulse.

Steps 250, 260 and 270 are optional (as indicated by dotted-line boxes) and can be implemented when module identification is performed. When steps 250 and 260 are performed, at step 250, a frequency (f) of the common mode AC voltage signal 125 is determined and a frequency (f) identification signal 165, which indicates the center frequency ($f_c$) of the common mode AC voltage signal 125, is generated. Then, based on the frequency (f) identification signal 165, at step 260 the method 200 determines which module is the source of the AC fault (ACF). For example, in one implementation, the module that is the source of the AC fault (ACF) can be determined by using the center frequency ($f_c$) of the common mode AC voltage signal 125 to perform a lookup in a lookup table which associates each module with a corresponding operating switching frequency of that module.

Once the ACF has been verified (step 248) and the module which is the source or cause of the ACF has been identified (step 260), the method can proceed to step 270, where information 185 is generated which identifies the module that is the source or cause of the AC fault (ACF). In one implementation, the information 185 comprises a fault indicator signal 185 which can include, for example, an output fault code with a corresponding module identifier (ID) which identifies the module which is causing the AC fault (ACF).

Figure 3B:
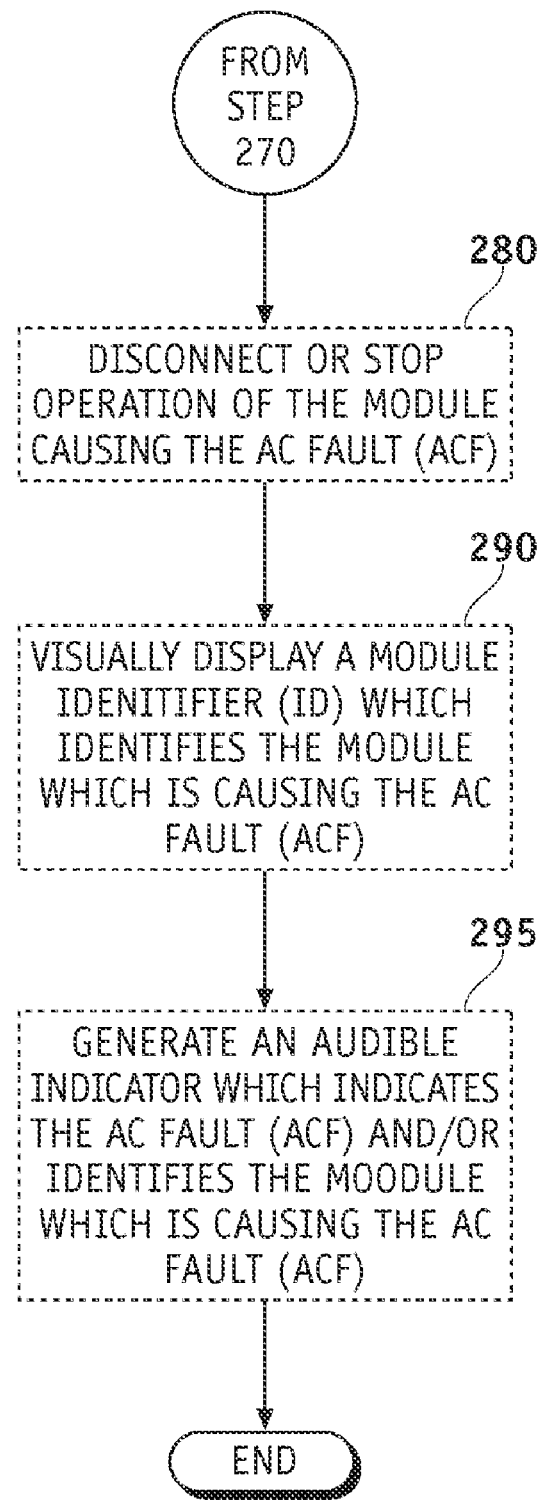

Steps 280, 290 and 295 are optional (as indicated as basedline boxes). The method 200 can optionally perform one or more of steps 280, 290, and 295, and in this regard, each of steps 290 and 295 are optional (as illustrated in FIG. 3 where step 280 can be performed in combination with either of steps 290, 295). In other implementations, two or more of steps 280, 290, and 295 can be performed in series and/or in parallel with each other (e.g., step 280, then step 290; step 280, then step 295; step 280, step 290, then step 295; step 280, step 290, then step 295; step 290, then step 295 or vice-versa, etc.).

When the method 200 proceeds to optional step 280, operation of the module causing the ACF can be stopped (e.g., turned off or disconnected from the high voltage DC bus 40). At optional step 290, a module identifier (ID) which identifies the module which is causing the AC fault (ACF) can be visually displayed on a user interface. At optional step 295, an audible indicator cab be generated which indicates the AC fault (ACF) condition and/or identifies the module which is causing the AC fault (ACF).

Figure 4:
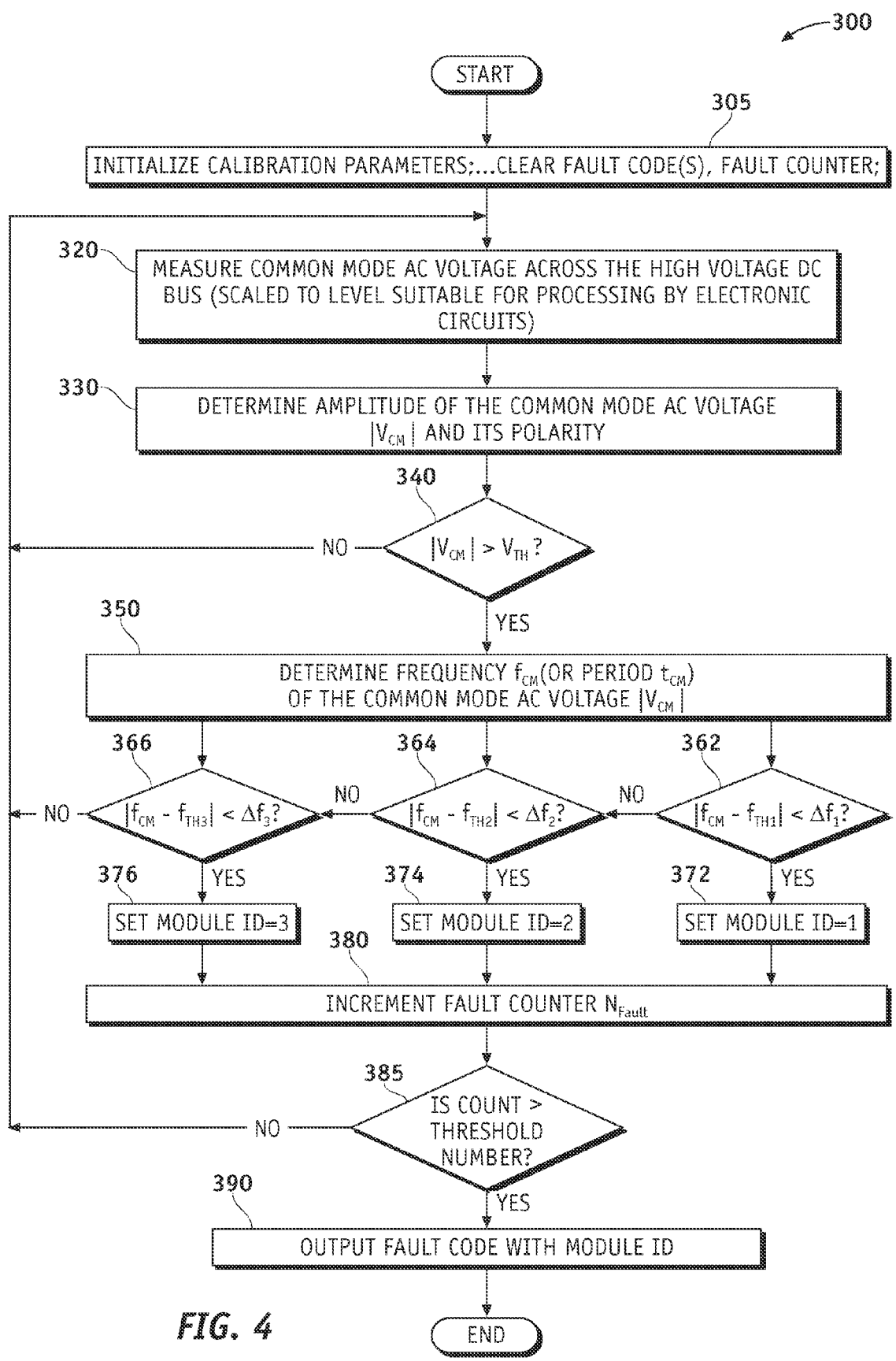
FIG. 4 illustrates another method for detecting, verifying and/or identifying an AC fault (ACF) according to another exemplary implementation of the present invention.

FIG. 4 illustrates a method 300 for detecting, verifying and identifying an AC fault (ACF) according to another exemplary implementation of the present invention. As above, method 300 can be applied in a variety of applications or implementations to detect an ACF, verify an ACF and/or identify a module, device or circuit which is a source of an ACF.

At step 305 a counter and/or other calibration parameters are initialized. A high-voltage DC input signal 115 is received, and at step 320, a common mode AC voltage signal ($V_{CM}$) 125 is measured by removing the differential (DC) voltage component from the high-voltage DC input signal 115. This results in a scaled, common mode AC voltage signal ($V_{CM}$) 125 which is scaled to a level suitable for processing by electronic circuits.

At step 330, a magnitude/amplitude of the common mode AC voltage signal ($V_{CM}$) 125 is determined, and at step 340, it is determined whether the magnitude of the common mode AC voltage signal ($V_{CM}$) 125 is greater than or equal to a fault detection threshold voltage ($V_{TH}$).

When the magnitude/amplitude of the common mode AC voltage signal ($V_{CM}$) 125 is less than the fault detection threshold voltage ($V_{TH}$), the cycle counter 152 resets, and the method 300 loops back to step 320.

When the magnitude/amplitude of the common mode AC voltage signal ($V_{CM}$) 125 is greater than or equal to the fault detection threshold voltage ($V_{TH}$), the method 300 proceeds to steps 350-376, where module identification is performed. At step 350, a common mode frequency ($f_{CM}$) of the common mode AC voltage signal ($V_{CM}$) 125 is determined. At step 362, 364, 366 a series of checks are performed to identify a module which in the source or cause of the ACF. For example, at step 362, it is determined whether an absolute value of the difference between the common mode frequency ($f_{CM}$) of the common mode AC voltage signal ($V_{CM}$) 125 and a first threshold frequency ($f_{TH1}$) is less than a first frequency differential ($\Delta f_1$). If the absolute value of the difference between the common mode frequency ($f_{CM}$) of the common mode AC voltage signal ($V_{CM}$) 125 and the first threshold frequency ($f_{TH1}$) is less than the first frequency differential ($\Delta f_1$), then method 300 proceeds to step 472 where a first module (Set Module ID=1) is identified as being the source or cause of the ACF. If the absolute value of the difference between the common mode frequency ($f_{CM}$) of the common mode AC voltage signal ($V_{CM}$) 125 and the first threshold frequency ($f_{TH1}$) is greater than or equal to the first frequency differential ($\Delta f_1$), then method 300 proceeds to step 364 where it is determined whether an absolute value of the difference between the common mode frequency ($f_{CM}$) and a second threshold frequency ($f_{TH2}$) is less than a second frequency differential ($\Delta f_2$). If the absolute value of the difference between the common mode frequency ($f_{CM}$) and the second threshold frequency ($f_{TH2}$) is less than the second frequency differential ($\Delta f_2$), then method 300 proceeds to step 374 where a second module (Set Module ID=2) is identified as being the source or cause of the ACF. If the absolute value of the difference between the common mode frequency ($f_{CM}$) and the second threshold frequency ($f_{TH2}$) is greater than or equal to the second frequency differential ($\Delta f_2$), then method 300 proceeds to step 366 where it is determined whether an absolute value of the difference between the common mode frequency ($f_{CM}$) and a third threshold frequency ($f_{TH3}$) is less than a third frequency differential ($\Delta f_3$).

If the absolute value of the difference between the common mode frequency ($f_{CM}$) and the third threshold frequency ($f_{TH3}$) is less than the third frequency differential ($\Delta f_3$), then method 300 proceeds to step 376 where a third module (Set Module ID=3) is identified as being the source or cause of the ACF. If the absolute value of the difference between the common mode frequency ($f_{CM}$) and the third threshold frequency ($f_{TH3}$) is greater than or equal to the third frequency differential ($\Delta f_3$), then method 300 loops back to step 320. Although FIG. 3 illustrates three check steps 362, 364, 366 being performed (i.e., when there are only three modules present that are potential ACF sources), it will be appreciated that any number of checks can be performed depending on the number of potential modules to be identified.

After identifying a module that is causing the ACF, the method 300 proceeds to step 380, where a fault counter ($N_{fault}$) is incremented. The fault counter ($N_{fault}$) counts a number of consecutive particular periods during which an ACF event is detected.

Method 300 then proceeds to step 385, where fault verification is performed. At step 385, it is determined whether a count maintained by the fault counter ($N_{fault}$), which indicates a number of consecutive ACF events detected, is greater than or equal to is greater than or equal to a particular threshold number ($N_{TH}$) (e.g., 3). When the number of consecutive particular periods during which an ACF-type pulse is received ($N_{fault}$) is greater than the particular threshold number ($N_{TH}$), detection of an ACF is verified. An actual AC fault (ACF) exists when the count ($N_{fault}$) exceeds the particular threshold number ($N_{TH}$) (e.g., 3) since this means that the common mode AC voltage signal 125 includes a continuous number of ACF-type pulses rather than an intermittent or random ACF-type pulse. Counting a number of ACF events reduces the likelihood of a false indicator, for instance, in a situation where a single pulse occurs that is not associated with an actual ACF.

When it is determined at step 385 that the count maintained by the fault counter ($N_{fault}$) is less than the particular threshold number ($N_{TH}$) (e.g., 3), the method 300 loops back to step 320, to continue monitoring the common mode AC voltage signal ($V_{CM}$) 125 for additional ACF voltage spikes. Notably, if another spike is not detected at step 340 before reaching a particular count, then the counter resets since the number of consecutive particular periods during which the counter input signal is received is less than a threshold number ($N_{TH}$) (e.g., 3), and it can therefore be assumed that the prior ACF-type pulses were intermittent or false fault indicators.

When it is determined at step 385 that the count maintained by the fault counter ($N_{fault}$) is greater than the particular threshold number ($N_{TH}$) (e.g., 3), the ACF has been verified and the module which is the source or cause of the ACF has been identified. The method 300 can then proceed to step 390. At step 390, operation of the module causing the ACF can be stopped (e.g., the module can turned off or disconnected from the high voltage DC bus 40), a module identifier (ID) can be generated which identifies the module which is causing the ACF and visually displayed on a user interface, and an audible indicator can be generated which indicates the ACF condition and/or identifies the module which is causing the ACF.

Some of the embodiments and implementations are described above in terms of functional and/or logical block components and various processing steps. However, it should be appreciated that such block components may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

In this document, relational terms such as first and second, and the like may be used solely to distinguish one entity or action from another entity or action without necessarily requiring or implying any actual such relationship or order between such entities or actions. Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for processing a high-voltage DC input signal received from a bus coupled to a module, the method comprising:
receiving the high-voltage DC input signal from the bus;
generating a common mode AC voltage signal ($V_{CM}$) by removing a differential mode voltage component from the high-voltage DC input signal;
measuring a magnitude of the common mode AC voltage signal ($V_{CM}$);
determining whether a measured magnitude of the common mode AC voltage signal ($V_{CM}$) is greater than or equal to a fault detection threshold voltage ($V_{TH}$);
generating an AC fault (ACF) detection signal when the measured magnitude of the common mode AC voltage signal ($V_{CM}$) is greater than or equal to the fault detection threshold voltage ($V_{TH}$);
receiving the ACF detection signal and the common mode AC voltage signal ($V_{CM}$);
maintaining a count which indicates a number of consecutive periods that the magnitude of the common mode AC voltage signal ($V_{CM}$) is greater than or equal to the fault detection threshold voltage ($V_{TH}$); and
incrementing the count maintained by a register in a cycle counter each time an ACF voltage spike is present in the common mode AC voltage signal ($V_{CM}$) while the cycle counter is enabled by the ACF detection signal.

2. A method according to claim 1, further comprising:
generating a fault verification signal to indicate that detection of an ACF has been verified when the count is greater than or equal to a particular threshold number, wherein the count is greater than or equal to a particular threshold number when the number of consecutive periods during which an ACF voltage spike is detected is greater than or equal to the particular threshold number thereby indicating that the common mode AC voltage signal ($V_{CM}$) includes a consecutive number of ACF pulses.

3. A method according to claim 2, wherein the ACF detection signal is a counter enable signal, and further comprising:
receiving the counter enable signal and the common mode AC voltage signal;
maintaining a count which indicates a number of consecutive periods that the magnitude of the common mode AC voltage signal ($V_{CM}$) is greater than or equal to the fault detection threshold voltage ($V_{TH}$);
incrementing the count each time an ACF voltage spike is present in the common mode AC voltage signal while the counter enable signal is being received; and
generating a fault verification signal to indicate that detection of the ACF has been verified when the count is greater than or equal to a particular threshold number, wherein the count is greater than or equal to a particular threshold number when the number of consecutive periods during which an ACF voltage spike is detected is greater than or equal to the particular threshold number thereby indicating that the common mode AC voltage signal includes a consecutive number of ACF pulses.

4. A method according to claim 1, wherein an AC fault (ACF) is caused by a module coupled to a bus of a hybrid/electric power train system the bus being coupled to a plurality of modules, wherein each module has a fundamental operating frequency ($f_{CM}$) associated therewith, and further comprising:
determining a frequency (f) of the common mode AC voltage signal; and
generating a frequency (f) identification signal which indicates a fundamental operating frequency ($f_{CM}$) within the common mode AC voltage signal.

5. A method according to claim 4, further comprising:
receiving the frequency (f) identification signal;
determining the one of the modules that is the source of the ACF based on the fundamental operating frequency ($f_{CM}$) specified in the frequency (f) identification signal; and
generating a module identification signal which identifies the one of the modules that is the source of the ACF.

6. A method according to claim 5, wherein the step of determining the one of the modules that is the source of the ACF based on the fundamental operating frequency ($f_{CM}$) specified in the frequency (f) identification signal, comprises:
performing a lookup in a lookup table which associates each module with a corresponding operating frequency of that module to determine the one of the modules that is the source of the ACF based on the fundamental operating frequency ($f_{CM}$) specified in the frequency (f) identification signal.

7. A method according to claim 6, further comprising:
generating fault indicator information which identifies the module which is causing the ACF based on the fault verification signal and the module identification signal, wherein the fault indicator information comprises an output fault code with a corresponding module identifier (ID) which identifies the module which is causing the ACF.

8. A method according to claim 7, further comprising:
generating a signal which stops operation of the module causing the ACF.

9. A method according to claim 7, further comprising:
generating a signal which causes visual display of a module identifier (ID) which identifies the module which is causing the ACF.

10. A method according to claim 7, further comprising:
generating a signal which causes an audible indicator which indicates the module which is causing the ACF.

11. A method for detecting an AC fault (ACF) caused by a module coupled to a bus of a hybrid/electric power train system, the method comprising:
receiving a high-voltage DC input signal from the bus;
generating a common mode AC voltage signal ($V_{CM}$) by removing a differential mode voltage component from the high-voltage DC input signal;
measuring a magnitude of the common mode AC voltage signal ($V_{CM}$);
determining whether a measured magnitude of the common mode AC voltage signal ($V_{CM}$) is greater than or equal to a fault detection threshold voltage ($V_{TH}$); and
generating an AC fault (ACF) detection signal when the measured magnitude of the common mode AC voltage signal ($V_{CM}$) is greater than or equal to the fault detection threshold voltage ($V_{TH}$).

12. A method according to claim 11, wherein the step of measuring a magnitude of the common mode AC voltage signal ($V_{CM}$), comprises:
measuring a magnitude of the common mode AC voltage signal ($V_{CM}$);

wherein the step of determining whether a measured magnitude of the common mode AC voltage signal ($V_{CM}$) is greater than or equal to a fault detection threshold voltage ($V_{TH}$) comprises:
determining whether a measured magnitude of the common mode AC voltage signal ($V_{CM}$) is greater than or equal to a fault detection threshold voltage ($V_{TH}$), wherein the common mode AC voltage signal ($V_{CM}$) comprises one or more ACF voltage spikes during an ACF event; and
wherein the step of generating an AC fault (ACF) detection signal when the measured magnitude of the common mode AC voltage signal ($V_{CM}$) is greater than or equal to the fault detection threshold voltage ($V_{TH}$) comprises:
generating an AC fault (ACF) detection signal to generate an ACF detection signal which indicates that an ACF event has been detected when the measured magnitude of the common mode AC voltage signal ($V_{CM}$) is greater than or equal to the fault detection threshold voltage ($V_{TH}$).

13. A method for detecting and verifying an AC fault (ACF) caused by a module coupled to a bus of a hybrid/electric power train system, wherein each module has a fundamental operating frequency ($f_{CM}$) associated therewith, the method comprising:
receiving a high-voltage DC input signal from the bus;
generating a common mode AC voltage signal ($V_{CM}$) by removing a differential mode voltage component from the high-voltage DC input signal;
measuring a magnitude of the common mode AC voltage signal ($V_{CM}$);
determining whether a measured magnitude of the common mode AC voltage signal ($V_{CM}$) is greater than or equal to a fault detection threshold voltage ($V_{TH}$); and
generating an AC fault (ACF) detection signal when the measured magnitude of the common mode AC voltage signal ($V_{CM}$) is greater than or equal to the fault detection threshold voltage ($V_{TH}$);
receiving the ACF detection signal and the common mode AC voltage signal ($V_{CM}$);
maintaining a count which indicates a number of consecutive periods that the magnitude of the common mode AC voltage signal ($V_{CM}$) is greater than or equal to the fault detection threshold voltage ($V_{TH}$);
incrementing the count each time an ACF voltage spike is present in the common mode AC voltage signal ($V_{CM}$) while the ACF detection signal is being received; and
generating a fault verification signal to indicate that detection of the ACF has been verified when the count is greater than or equal to a particular threshold number, wherein the count is greater than or equal to a particular threshold number when the number of consecutive periods during which an ACF voltage spike is detected is greater than or equal to the particular threshold number thereby indicating that the common mode AC voltage signal ($V_{CM}$) includes a consecutive number of ACF pulses.

14. A method for processing a DC input signal received from a bus coupled to a module, the method comprising:
receiving the DC input signal from the bus;
removing a differential mode voltage component from the DC input signal to generate a common mode AC voltage signal ($V_{CM}$) biased at approximately zero volts;
measuring a magnitude of the common mode AC voltage signal ($V_{CM}$);
generating an AC fault (ACF) detection signal when the measured magnitude of the common mode AC voltage signal ($V_{CM}$) is greater than or equal to a threshold voltage ($V_{TH}$),
maintaining a count which indicates a number of consecutive periods that the magnitude of the common mode AC voltage signal ($V_{CM}$) is greater than or equal to the threshold voltage ($V_{TH}$); and
incrementing the count each time an ACF voltage spike is present in the common mode AC voltage signal ($V_{CM}$) while the ACF detection signal is generated.

15. A method according to claim 14, further comprising:
generating a fault verification signal to indicate that detection of the ACF has been verified when the count is greater than or equal to a particular threshold number, wherein the count is greater than or equal to a particular threshold number when the number of consecutive periods during which an ACF voltage spike is detected is greater than or equal to the particular threshold number thereby indicating that the common mode AC voltage signal ($V_{CM}$) includes a consecutive number of ACF pulses.

16. A method according to claim 15, wherein an AC fault (ACF) is caused by a module coupled to a bus of a hybrid/electric power train system the bus being coupled to a plurality of modules, wherein each module has a fundamental operating frequency ($f_{CM}$) associated therewith, and further comprising:
determining a frequency (f) of the common mode AC voltage signal;
generating a frequency (f) identification signal which indicates a fundamental operating frequency ($f_{CM}$) within the common mode AC voltage signal;
determining the one of the modules that is the source of the ACF based on the fundamental operating frequency ($f_{CM}$) specified in the frequency (f) identification signal; and
generating a module identification signal which identifies the one of the modules that is the source of the ACF.

17. A method according to claim 16, further comprising:
identifying the module which is causing the ACF based on the fault verification signal and the module identification signal.

18. A method according to claim 16, further comprising:
stopping operation of the module causing the ACF.

* * * * *